United States Patent
Lin et al.

(10) Patent No.: US 8,350,605 B2
(45) Date of Patent: Jan. 8, 2013

(54) PHASE-LOCKED LOOP WITH NOVEL PHASE DETECTION MECHANISM

(75) Inventors: Peng-Fei Lin, Hsinchu (TW); Ming-Chi Lin, Hsinchu (TW); Po-Hao Yu, Hsinchu (TW)

(73) Assignee: Moai Electronics Corporation, Hsinchu (TW)

( * ) Notice: Subject to any disclaimer, the term of this patent is extended or adjusted under 35 U.S.C. 154(b) by 275 days.

(21) Appl. No.: 12/789,453

(22) Filed: May 27, 2010

(65) Prior Publication Data

US 2011/0291714 A1    Dec. 1, 2011

(51) Int. Cl.
*H03L 7/06*    (2006.01)
(52) U.S. Cl. ........................................... 327/156
(58) Field of Classification Search .................. 327/156
See application file for complete search history.

(56) References Cited

U.S. PATENT DOCUMENTS

2010/0085089 A1*    4/2010    Weng et al. .................... 327/156

* cited by examiner

*Primary Examiner* — Daniel Rojas
(74) *Attorney, Agent, or Firm* — Lin & Associates IP, Inc.

(57) ABSTRACT

A phase-locked loop (PLL) with novel phase detection mechanism is provided, including a phase frequency detector (PFD), a controller, a digital-to-analog (D2A) module, and a voltage-controlled oscillator/current-controlled oscillator (VCO/ICO), wherein PFD has a reference signal input and an input from the output signal of the VCO/ICO and is connected to the controller, the controller is then further connected to the D2A module, the D2A module converts the control signal from the controller into an analog voltage to control the frequency and phase of VCO/ICO. It is worth noting that the PFD of the present invention has a novel phase detection mechanism so that the phase detection can be accomplished by observing signal level transitions of the reference signal input and a delayed reference signal with respect to the output signal of the VCO/ICO without edge alignment. In addition, the novel phase detection mechanism also allows flexible reference signal input.

11 Claims, 5 Drawing Sheets

PHASE-LOCKED LOOP WITH NOVEL PHASE DETECTION MECHANISM

FIELD OF THE INVENTION

The present invention generally relates to a phase-locked loop (PLL), and more specifically to a phase-locked loop with novel phase detection mechanism.

BACKGROUND OF THE INVENTION

A phase-locked loop (PLL) is a frequency control system commonly used in a wide range of circuit designs, including, clock generation, clock recovery, spread spectrum, de-skewing, clock distribution, jitter and noise reduction, frequency synthesis, just to name a few. The operation of PLL is based on the phase difference between an input signal and a feedback of a voltage-controlled oscillator (VCO). PLL is widely used as clock generator in devices and hosts supporting high speed transmission protocols, such as, USB2.0, as an important component for synchronization for data transmission. FIG. 1 shows a schematic view of a conventional PLL. As shown in FIG. 1, a conventional PLL includes a phase frequency detector (PFD) 101, a loop filter 102, a VCO 103 and a divider 104. As shown in FIG. 1, PFD 101 receives a reference signal 110 and a feedback signal 104a from divider 104, and outputs a control signal 101a indicating whether the feedback signal is lagging or leading the reference signal. Loop filter 102 converts control signal 101a into a voltage signal 102a to be used by VCO 103 as a bias. VCO 103, based on voltage signal 102a, oscillates faster or slower to generate an output signal 103a. Output signal 103a is also fed to divider 104 to become the feedback signal 104a prior to feeding to PFD 101. In this manner, PLL is able to generate a stable output signal, which is also the reason why PLL is widely used as a clock generator in addition to other applications. In the scenario of clock generator, output signal 103a is the clock provided to the remaining circuits in the device for further controlling and synchronization of the operations of the device.

However, in a conventional PLL, reference signal 110 is usually from a fixed external source, such as, a crystal able to generate clock, as shown in FIG. 1. Final output signal 103a is usually a signal having a frequency that is a harmonic of the external crystal. For example, for PLL used in a USB2.0 application, a 480-MHz clock rate may be generated by using a 12 MHz crystal as the source of reference signal 110.

Generally, the phase frequency detector often used in a conventional PLL design relies on the relative timing of the edge, i.e., phase, of the feedback signal and the reference signal. In this situation, a constant output proportional to the phase difference is produced when both signals are at the same frequency. In other words, the phase detection relies on the comparison of the rising or falling edge. On the other hand, a logic gate-based phase detector used in PLL provides the advantage of quickly forcing the VCO to synchronize with the reference signal even when the frequency of the reference signal is substantially different from the initial output frequency of the VCO. FIG. 2 shows a conventional phase detection mechanism based on the edge alignment. This edge alignment requirement imposes restriction on certain application, such as, in high speed applications.

Another restriction of the conventional phase frequency detector is that a fixed external source is required. This not only adds the cost of the device, but also prohibits the flexibility of the design. It is thus advantageous to devise a novel phase detection mechanism for flexible PLL designs and lowering manufacturing cost.

SUMMARY OF THE INVENTION

The present invention has been made to overcome the above-mentioned drawback of conventional PLL design. The primary object of the present invention is to provide a PLL with novel phase detection mechanism to enable flexibility in phase detection applicable to high speed applications.

Another object of the present invention is to provide a PLL with novel phase detection mechanism to allow flexible reference signal inputs and free of a separate reference signal source to lower the manufacturing cost and complexity.

To achieve the above object, the present invention provides a PLL with novel phase detection mechanism, including a phase frequency detector (PFD), a controller, a digital-to-analog (D2A) module, and a voltage-controlled oscillator/current-controlled oscillator (VCO/ICO), wherein PFD has a reference signal input and an input from output signal of the VCO/ICO and is connected to the controller, the controller is then further connected to D2A module, D2A module converts the control signal from the controller into an analog voltage to control the frequency and phase of VCO/ICO. It is worth noting that the PFD of the present invention has a novel phase detection mechanism so that the phase detection does not rely on edge alignment. In addition, the novel phase detection mechanism also allows flexible reference signal input, as opposed to the aforementioned fixed external source, such as, a crystal.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The PLL of the present invention uses a novel phase detection mechanism. As aforementioned the conventional phase frequency detector often uses a fixed external source, such as, a crystal, as the reference signal. In this manner, the final output signal of the PLL usually is a harmonic of the reference signal. For example, in USB2.0, the 480 MHz clock rate can be obtained by a fixed external 12 MHz crystal as source of reference clock.

The novel phase detection mechanism does not require a fixed external source. Instead, the phase detection mechanism of the PLL according to the present invention is to analyze the reference signal and the VCO output signal before generating control signal to the controller. The final output signal is related to the reference signal, but not necessarily a harmonic of the frequency of the reference signal. The following describes how the reference signal and output signal are analyzed in phase detection according to the present invention.

Figure 1:
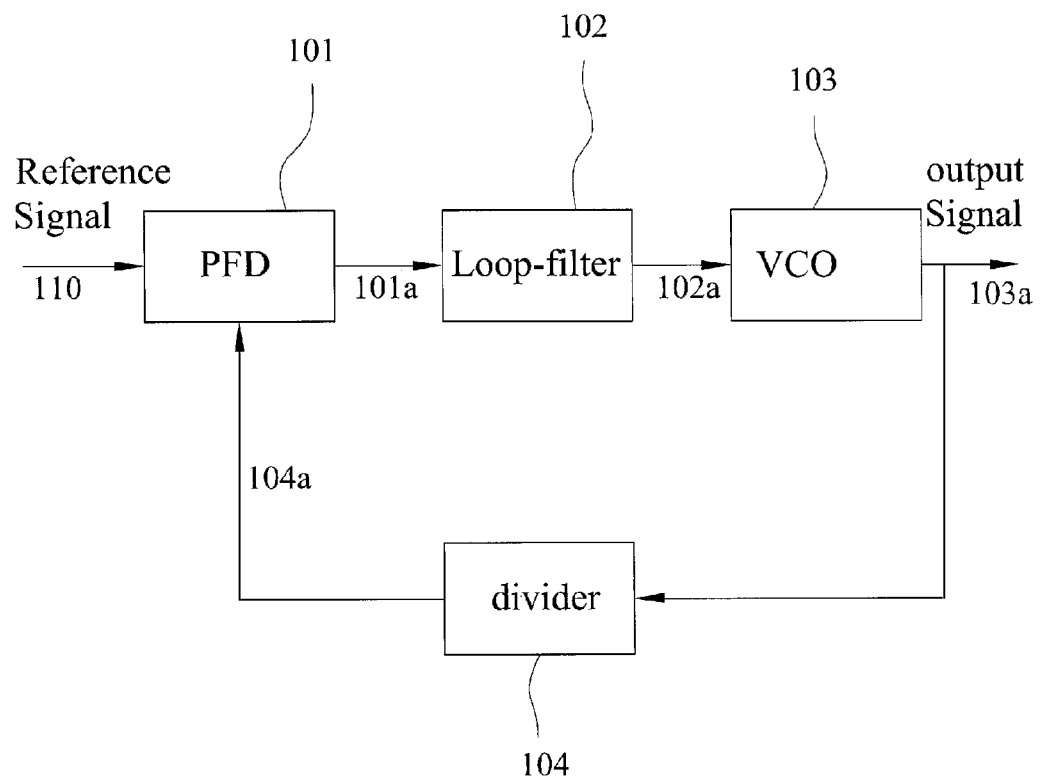
FIG. 1 shows a schematic view of a conventional phase-locked loop (PLL)
Figure 2:
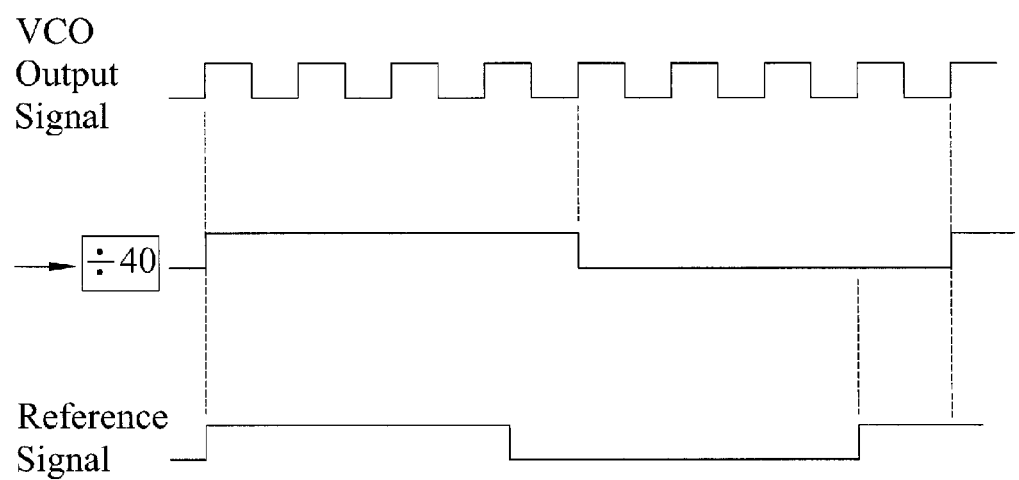
FIG. 2 shows a schematic view of the waveform of the conventional phase detection based on edge alignment.
Figure 3:
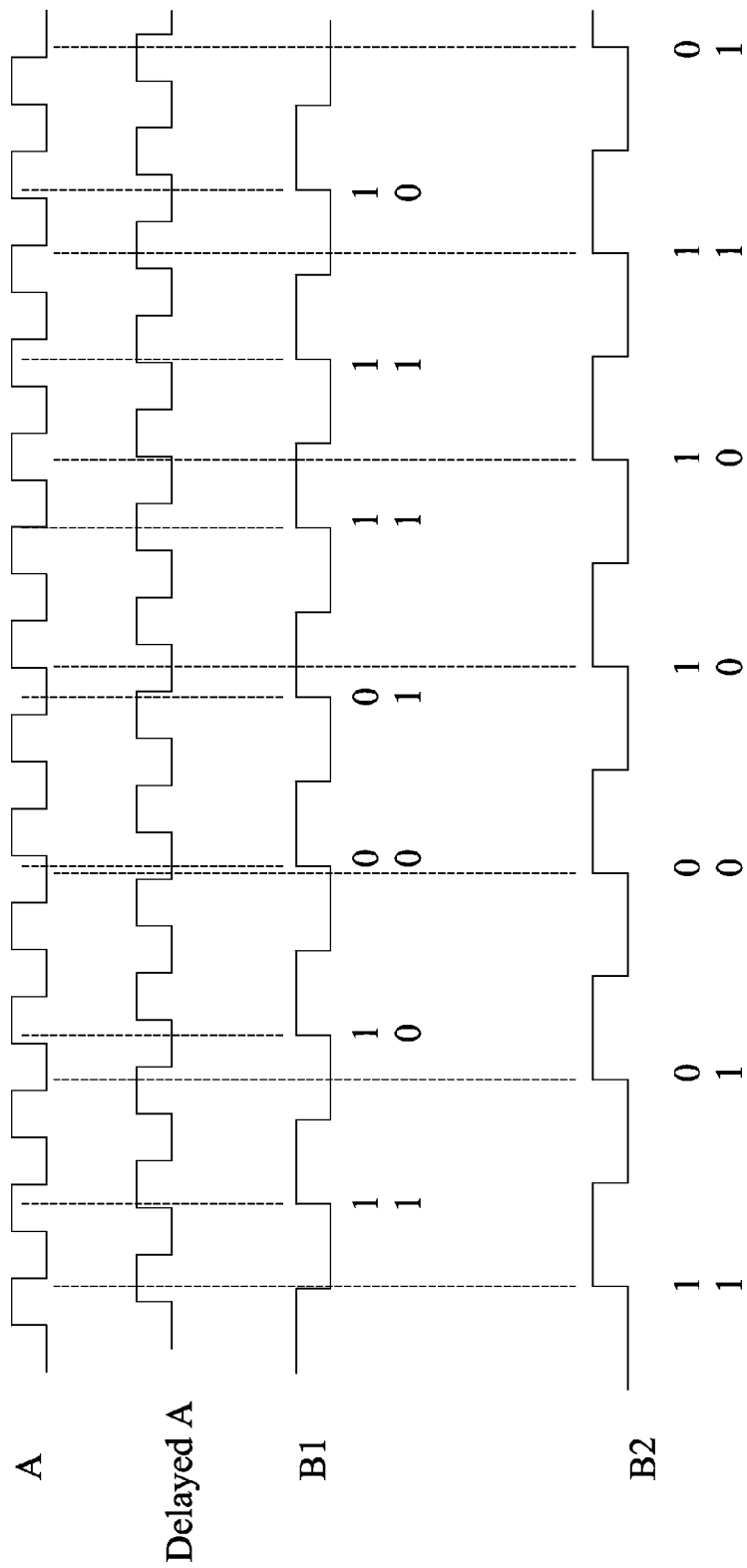
FIG. 3 shows a schematic view of a first exemplary waveform of the novel phase detection according to the present invention.

FIG. 3 shows a schematic view of a first exemplary waveform of the novel phase detection according to the present invention. For simplicity, the waveforms used in this exemplary embodiment are regular periodic waveform, i.e., 1, 0, 1, 0, 1, 0, ... sequence. As shown in FIG. 3, the first waveform is marked A and the second waveform is the delayed A, i.e., a waveform identical to signal A with delayed phase. The third waveform shows a B1 signal that has a higher frequency than half of the frequency of signal A. For simplicity, signal A can be viewed as a signal to be observed by observer signal B. As shown in FIG. 3, if both signal A and the delayed A are sampled on the rising edges of signal B1, four different pairs, i.e., (1,1), (1,0), (0,0), (0,1), can be observed, where the first item of each pair is the level of signal A and the second item is the level of the delayed A. Furthermore, transitions (1,1)->(1,0), (1,0)->(0,0), (0,0)->(0,1), (0,1)->(1,1) can be observed. In other words, when the observer frequency is higher than half of the observed frequency, any combination of the above four transitions, i.e., (1,1)->(1,0), (1,0)->(0,0), (0,0)->(0,1), (0,1)->(1,1), can be observed. Similarly, the fourth waveform shows a B2 signal that has a lower frequency than half of the frequency of signal A. If both signal A and the delayed A are sampled on the rising edges of the fourth waveform (i.e., signal B2), four different pairs, i.e., (1,1), (1,0), (0,0), (0,1), can be observed, where the first item of each pair is the level of signal A and the second item is the level of the delayed A. Furthermore, transitions (1,1)->(0,1), (0,1)->(0,0), (0,0)->(1,0), (1,0)->(1,1) can be observed. In other words, when the observer frequency is lower than half of the observed frequency, any combination of the above four transitions, i.e., (1,1)->(0,1), (0,1)->(0,0), (0,0)->(1,0), (1,0)->(1,1), can be observed. The observation from the exemplary waveform shows that the transitions (1,1)->(1,0), (1,0)->(0,0), (0,0)->(0,1), (0,1)->(1,1) imply that the frequency of the observer, e.g., B1, is faster than the half of frequency of the observed, e.g., A, while the transitions (1,1)->(0,1), (0,1)->(0,0), (0,0)->(1,0), (1,0)->(1,1) imply that the frequency of the observer, e.g., B2, is slower than half of the frequency of the observed, e.g., A.

Figure 4:
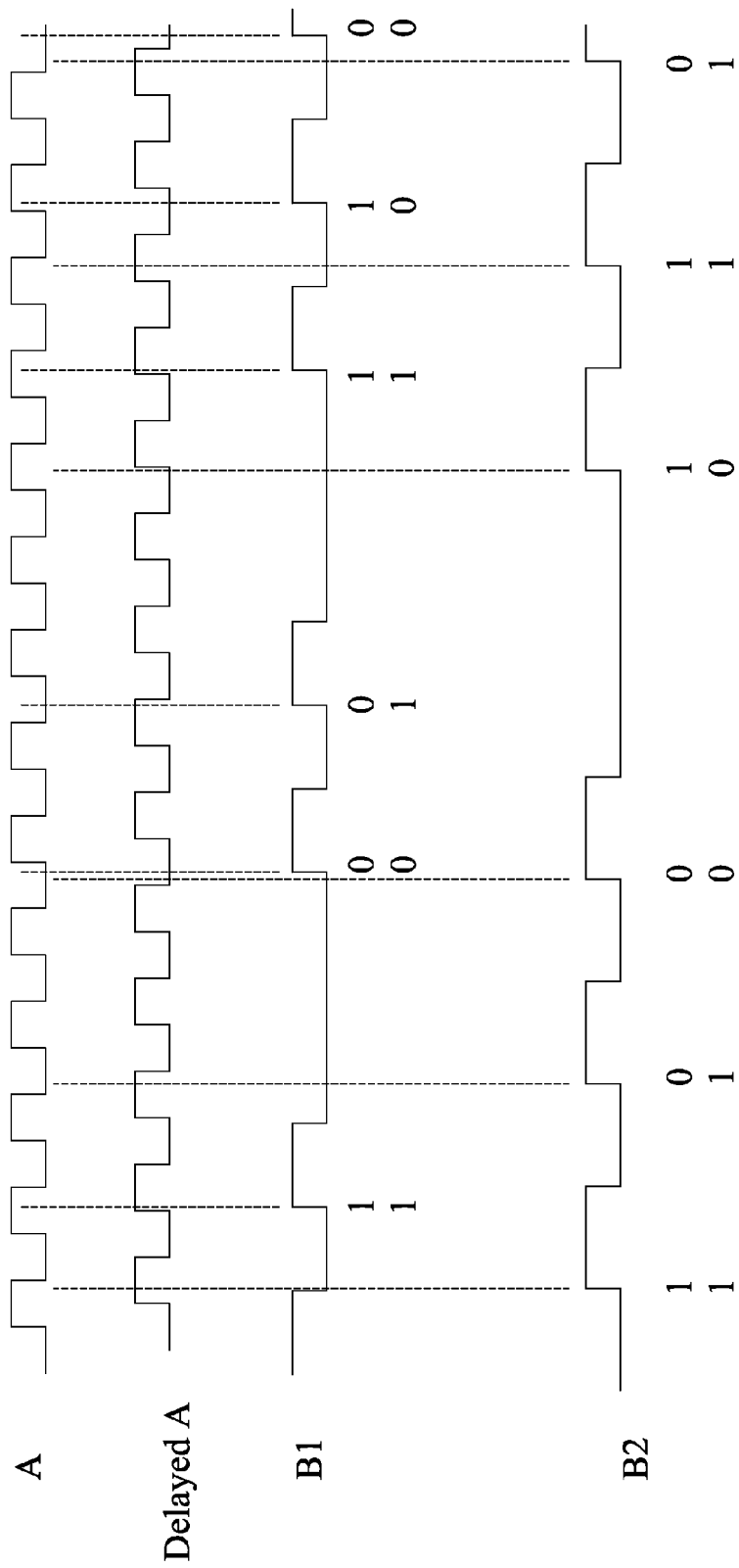
FIG. 4 shows a schematic view of a second exemplary waveform of the novel phase detection according to the present invention.

FIG. 4 shows a schematic view of a second exemplary waveform of the novel phase detection according to the present invention. This exemplary waveform is generalized to show that the observation of transition patterns of FIG. 3 can also be extended to irregular or non-periodic observer waveforms, i.e., B1 and B2. As shown in FIG. 4, the first waveform is signal A and the second waveform is delayed A, respectively. The third waveform shows an observer signal B1 that has a higher frequency than half of the frequency of signal A. If both signal A and delayed A are sampled on the rising edges of observer signal B1, a sequence of (1,0), (0,0), (0,1), (1,1), (1,0), (0,0) ... can be observed. Again, four different types of transitions, i.e., (1,1)->(1,0), (1,0)->(0,0), (0,0)->(0,1), (0,1)->(1,1), can be observed at various positions in the above observed sequence of pairs. Similarly, the fourth waveform shows an observer signal B2 that has a lower frequency than half of the frequency of signal A. If both signal A and the delayed A are sampled on the rising edges of the fourth waveform (i.e., observer signal B2), a sequence of (1,1), (0,1), (0,0), (1,0), (1,1), (0,1) ... is observed, Also similarly, four different types of transitions, i.e., (1,1)->(0,1), (0,1)->(0,0), (0,0)->(1,0), (1,0)->(1,1), can be observed at various positions in the above observed sequence of pairs. Hence, the appearance of transitions can be used to indicate the relative frequency between the observed signal and the observer signal even when the observer signal has a non-periodic and irregular waveform.

The results concluded from the above two exemplars is that the relation between the observed frequency and the observer frequency can be detected by observing the transitions found in the sequence of the observed signal pairs. When the observer frequency is higher than half of the observed frequency, e.g., B1>A in the above exemplars, four different types of transitions, i.e., (1,1)->(1,0), (1,0)->(0,0), (0,0)->(0,1), (0,1)->(1,1), can be found in the sequence of observed pairs. On the other hand, when the observer frequency is lower than half of the observed frequency, e.g., B2<A in the above exemplars, four different types of transitions, i.e., (1,1)->(0,1), (0,1)->(0,0), (0,0)->(1,0), (1,0)->(1,1), can be found in the sequence of observed pairs. All the other types of transitions, such as, (1,1)->(0,0), (1,0)->(0,1) or vice versa, can be safely discarded without affecting the detection mechanism.

This detection of the relation between the transition pattern of the observed signal and the relative frequencies of the observer and observed signals has two important implications. The first is that the phase detection is no longer required to align edges of the reference signal and the VCO/ICO output signal prior to the comparison. This is significant because edge alignment imposes difficult restriction for phase detection on high speed application. The second implication is that the reference signal is no longer required to be a fixed external source, such as, a crystal. Instead, the reference signal can be any sequence of digital signals, and the novel phase detection mechanism is able to perform the necessary phase detection operation for the PLL. With this novel phase detection mechanism, the PFD can easily output a signal indicating the relation between an observed frequency and an observer frequency based on the type of transitions found in sequence of observed signal pairs.

Figure 5:
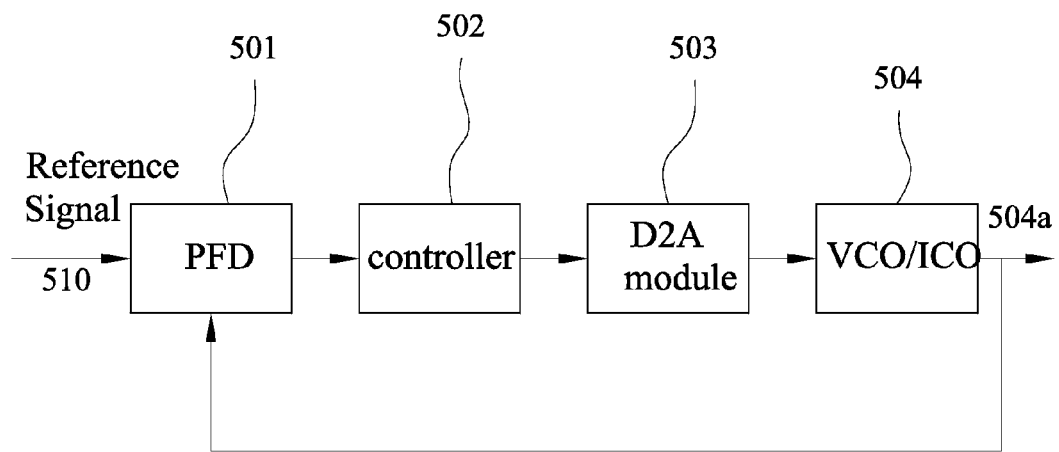
FIG. 5 shows a schematic view of a phase-locked loop (PLL) with novel phase detection mechanism.

Accordingly, FIG. 5 shows a schematic view of a phase-locked loop (PLL) with novel phase detection mechanism according to the present invention. As shown in FIG. 5, a PLL of the present invention includes a phase frequency detector (PFD) 501, a controller 502, a digital-to-analog (D2A) module 503, and a voltage-controlled oscillator (VCO)/current-controlled oscillator (ICO) 504. PFD 501 has a reference signal input 510 and an input from output signal 504a of VCO/ICO 504 and is connected to controller 502. Controller 502 is then further connected to D2A module 503, and D2A module 503 converts the control signal from controller 502 into an analog voltage or current to control the frequency and phase of VCO/ICO 504. It is worth noting that PFD 501 of the present invention has a novel phase detection mechanism based on the exemplary waveforms of FIG. 3 and FIG. 4. As described above and shown in FIGS. 3 and 4, a delayed reference signal needs to be derived from reference signal input 510 by PFD 501. Hence, PFD 501 compares VCO output signal 504a, reference signal 510 and the delayed reference signal to generate a signal indicating whether the VCO output signal is faster or slower than the frequency of reference signal. Based on the signal received from PFD 501, controller 502 is to control the output analog voltage or current of D2A module 503 to control the frequency and phase of output signal 504a of VCO/ICO 504.

It is worth noting that when reference signal 510 stops or disappears, controller 502 will maintain the original signal prior to the stopping of reference signal 510, i.e., the control signal to D2A module 503 is kept so that D2A module 503 will not change the analog voltage/current output to VCO/ICO to change the frequency and phase of output signal 504a. In other words, the output signal 504a is kept, i.e., locked, until reference signal 510 appears again. In this manner, the PFD can switch to a different reference signal as the basis for phase detection comparison. An exemplary embodiment to realize the "locking" of the sign is to implement D2A module 503 with a counter or any equivalent mechanism that can be incremented and decremented so that a signal indicating a faster or a slower frequency can increment or decrement the value accordingly. When reference signal 510 disappears, the counter or the equivalent mechanism keeps the value so that no increment or decrement operation is performed to change the kept value.

A major application of the PLL with novel phase detection mechanism of the present invention is that a device, such as USB device, can use the data stream from a host, such as a PC, as the reference signal for synchronization.

As mentioned above, PFD 501 of the present invention has a novel phase detection mechanism based on the exemplary waveforms of FIG. 3 and FIG. 4. To determine whether the VCO output signal is faster or slower than the frequency of reference signal 510, reference signal 510 is delayed in PFD 501 to form a delayed reference signal having the same waveform as reference signal 510 with a phase delay similar to deriving the delayed A from signal A shown in FIG. 3 or FIG. 4. Reference signal 510, the delayed reference signal and the VCO output signal 504a are observed, compared and analyzed to form signal transitions in PFD 501 according to the principle shown in FIGS. 3 and 4. It is also worth noting that the novel phase detection mechanism can further extended to include more than one delayed signal to speed up the convergence when the difference between the observer frequency and the observed frequency is very large. For example, a second delayed signal A' with a slight phase delay, a third delayed signal A" with further phase delay, and so on, can be added so that the observed signal tuple (A, A', A" . . . ) is recorded in the novel phase detection mechanism to accelerate the convergence of the different frequencies.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A phase-locked loop (PLL) with novel phase detection mechanism, comprising:
    a phase frequency detector (PFD), having a first input and a second input and generating a signal based on relative frequencies of said first input and said second input by comparing and analyzing a plurality of observed signal levels of said second input and at least a delayed version of said second input to indicate whether frequency of said second input is faster or slower than half of the frequency of said first input, said plurality of observed signal levels being obtained by sampling signal levels of said second input and said at least a delayed version of said second input when said first input changes from a first level to a second level, and said delayed version of said second input being formed by delaying said second input with a phase delay;
    a controller, connected to said PFD for receiving said signal from said PFD and generating a control signal;
    a digital-to-analog (D2A) module, connected to said controller for receiving said control signal and generating an analog voltage/current output; and
    a voltage-controlled oscillator (VCO), connected to said D2A module for receiving said analog voltage/current output to adjust an output signal accordingly;
    wherein said second input of said PFD is connected to a reference signal and said first input of said PFD is connected to said output signal of said VCO.

2. The PLL as claimed in claim 1, wherein said VCO is replaced by a current-controlled oscillator (ICO).

3. The PLL as claimed in claim 1, wherein said PFD compares said plurality of observed signal levels to form a sequence of signal transitions, and the frequency of said first input is determined to be faster than half of the frequency of said second input if said sequence of signal transitions is identical to a first group of transition types.

4. The PLL as claimed in claim 3, wherein the frequency of said first input is determined to be slower than half of the frequency of said second input if said sequence of signal transitions is identical to a second group of transition types.

5. The PLL as claimed in claim 1, wherein said reference signal is generated from an external crystal oscillator.

6. The PLL as claimed in claim 1, wherein said reference signal is digital data from a host.

7. The PLL as claimed in claim 3, wherein said first group of transition types comprises (1,1)->(1,0), (1,0)->(0,0), (0,0)->(0,1), (0,1)->(1,1), for the observed signal levels of said second input and said delayed version of said second input, wherein in each number pair (x, y), x is the observed signal level of said second input and y is the observed signal level of said delayed version of said second input.

8. The PLL as claimed in claim 4, wherein said second group of transition types comprises (1,1)->(0,1), (0,1)->(0,0), (0,0)->(1,0), (1,0)->(1,1) for the observed signal levels of said second input and said delayed version of said second input, wherein in each number pair (x, y), x is the observed signal level of said second input and y is the observed signal level of said delayed version of said second input.

9. The PLL as claimed in claim 1, wherein when said reference signal stops or disappears, said D2A module keeps an original control signal value prior to stopping of said reference signal so that said D2A module will not change said analog voltage/current output to said VCO/ICO to change frequency and phase of said output signal.

10. The PLL as claimed in claim 9, wherein said D2A module is implemented with a counter or an equivalent mechanism able to increment or decrement.

11. The PLL as claimed in claim 1, wherein said at least a delayed version of said second input comprises a plurality of delayed versions of said second input, and each delayed version of said second input has a same waveform with a different phase delay from each other.

* * * * *